(12) United States Patent
Rinneberg et al.

(10) Patent No.: US 7,049,818 B2
(45) Date of Patent: May 23, 2006

(54) APPARATUS FOR THE PRODUCTION OF RADIO FREQUENCY B1 FIELDS FOR NMR USING CURRENT SHEET ANTENNAS

(75) Inventors: Herbert Rinneberg, Berlin (DE);
Frank Seifert, Hohen Neuendorf (DE);
Sven Junge, Ettlingen (DE)

(73) Assignees: Physikalisch-Technische Bundesanstalt Braunschweig und Berlin, Braunschweig (DE); Bruker BioSpin MRI GmbH, Ettlingen (DE)

( * ) Notice: Subject to any disclaimer, the term of this patent is extended or adjusted under 35 U.S.C. 154(b) by 0 days.

(21) Appl. No.: 10/887,870

(22) Filed: Jul. 12, 2004

(65) Prior Publication Data

US 2005/0024054 A1 Feb. 3, 2005

(30) Foreign Application Priority Data

Jul. 26, 2003 (DE) ................................. 103 34 170

(51) Int. Cl.
*G01V 3/00* (2006.01)
(52) U.S. Cl. ...................................... 324/318; 324/319
(58) Field of Classification Search ................ 324/318, 324/319, 322, 309, 307, 300; 600/410
See application file for complete search history.

(56) References Cited

U.S. PATENT DOCUMENTS

| 4,589,422 | A |   | 5/1986  | James |         |
|-----------|---|---|---------|-------|---------|
| 4,600,018 | A |   | 7/1986  | James |         |
| 4,721,913 | A |   | 1/1988  | Hyde  | 324/319 |
| 4,724,389 | A |   | 2/1988  | Hyde  | 324/39  |
| 4,841,249 | A |   | 6/1989  | Duerr |         |
| 5,144,241 | A |   | 9/1992  | Oppelt|         |
| 5,986,454 | A | * | 11/1999 | Leifer| 324/318 |
| 6,100,691 | A | * | 8/2000  | Yeung | 324/318 |
| 6,285,189 | B1| * | 9/2001  | Wong  | 324/318 |
| 6,348,794 | B1| * | 2/2002  | Nabetani et al. | 324/318 |
| 6,377,047 | B1| * | 4/2002  | Wong et al. | 324/318 |

(Continued)

FOREIGN PATENT DOCUMENTS

DE      101 24 465      11/2002

(Continued)

OTHER PUBLICATIONS

Ray F. Lee et al., "Lumped-element planar strip array (LPSA) for MRI at 1.5T", Proc. Intl. Soc. Mag. Reson. Med. 10 (2002).

(Continued)

*Primary Examiner*—Brij B. Shrivastav
(74) *Attorney, Agent, or Firm*—Paul Vincent

(57) ABSTRACT

The invention concerns an apparatus for generating and/or detecting radio frequency (RF)-B1 fields in an investigational volume (10) of a magnetic resonance (MR) device, wherein the apparatus comprises a tubular surface coil (1; 20; 30; 41–44; 51–54; 61) which is formed from a conducting strip and is capacitively closed at least two neighboring ends, wherein the ratio between length L and width W of the strip is ≦30, and wherein the volume under investigation (10) is disposed outside of the space surrounded by the strip, bordering an outer surface (9) of the surface coil (1; 20; 30; 41–44; 51–54; 61) such that the B1 field lines, generated by the surface coil (1; 20; 30; 41–44; 51–54; 61) in the volume under investigation (10) extend substantially parallel to this outer surface (9) thereby producing an NMR transmitting and receiving apparatus with improved properties, in particular, one permitting precise influence of the distribution of the RF-B1 field.

15 Claims, 4 Drawing Sheets

U.S. PATENT DOCUMENTS

| | | |
|---|---|---|
| 6,411,090 B1 | 6/2002 | Boskamp |
| 6,727,703 B1 * | 4/2004 | Lee .............................. 324/322 |
| 2002/0171589 A1 | 11/2002 | Nistler |

FOREIGN PATENT DOCUMENTS

| | | |
|---|---|---|
| EP | 0 304 249 | 2/1989 |
| EP | 1 273 926 | 1/2003 |
| GB | 2 135 891 | 9/1984 |
| GB | 2 221 995 | 2/1990 |
| GB | 2 258 046 | 1/1993 |
| GB | 2 390 165 | 12/2003 |
| WO | WO 00/72033 | 11/2000 |

OTHER PUBLICATIONS

Ananda Kumar, Paul A. Bottomley, "Tunable Planar Strip Array Antenna", Proc. Intl. Soc. Mag. Reson. Med. 10 (2002).

* cited by examiner

US 7,049,818 B2

APPARATUS FOR THE PRODUCTION OF RADIO FREQUENCY B1 FIELDS FOR NMR USING CURRENT SHEET ANTENNAS

This application claims Paris Convention priority of DE 103 34 170.6 filed Jul. 26, 2003 the complete disclosure of which is hereby incorporated by reference.

BACKGROUND OF THE INVENTION

The invention concerns an apparatus for generating and/or detecting radio frequency (RF) B1 fields in an investigational volume of a magnetic resonance (MR) device, wherein the apparatus comprises a surface coil.

Current sheet antennas are used for hyperthermia treatments as disclosed in publications by Johnson (U.S. Pat. No. 4,589,422, GB 2 135 891 and U.S. Pat. No. 4,600,018).

Nuclear magnetic resonance (NMR) plays an important role in analytical chemistry as well as in medical imaging methods.

In NMR methods, a sample to be investigated is located in a static $B_0$ field and is exposed to one or more radio frequency (RF) pulses. The RF signals emanating from the sample are subsequently detected and evaluated.

Volume coils, such as the so-called TEM resonator (see WO 00/72033 A2), are conventionally used to generate (Tx) and detect (Rx) the RF fields and signals. The TEM resonator has a radially closed RF shield which comprises a plurality of individual interior resonance elements which are capacitively connected to the RF shield. Magnetic coupling of the individual resonance elements produces a transverse resonant mode.

DE 101 24 465 A1 discloses a volume coil with decoupled resonator elements, wherein all resonator elements are each individually fed with a defined phase and amplitude. Such volume coils are known as birdcage coils and have conductor surfaces disposed along the $B_0$ field. Feeding of the individual resonance elements via power splitters and phase shifters is also known (EP 1 273 926 A2 or U.S. Pat. No. 6,411,090 B1) to thereby obtain control over the $B_1$ field distribution within a particular volume.

In open MRI (magnetic resonance imaging) systems, so-called planar RF antennas (planar surface coils, planar coils) are used (see DE 101 24 737 A1). They consist of a rectangular, disc-shaped, or annular conductor element whose surface normal (or annular axis) is orthogonal: to the $B_0$ field. The planar RF antennas are capacitively connected to a ground shield. The planar RF antenna generates a B1 field which is orthogonal to its antenna plane and therefore transverse to $B_0$. Suitable switching of the capacitances generates a linearly or circularly polarized RF-B1-field.

In addition to volume coils, local coils are also conventionally used (see ISMRM abstr. 2002, no. 321/322). Local coils generate and detect NMR signals within a limited investigational volume of the MRI device. The local coils are formed from so-called planar strip arrays. They consist of a plurality of individual flat, rectangular conductors which are capacitively connected to ground at regular intervals. The ground reference is realized with a flat, metallic conducting surface. The individual conductors are separately fed and may be decoupled from each other using impedance networks (inductances and capacitances).

To heat up individual human body parts (hyperthermy), current sheet antennas (CSA) are conventionally disposed with their outer side on the surface of the body part and fed with an alternating current. In particular, rectangular tubular applicators are known which operate at a frequency range of 27 to 450 MHz. The electric RF fields which are generated by these antennas are used to heat up the tissue to approximately 40° C. or more (compare Johnson loc. cit.). The applicators have a defined resonance frequency and are optimised to effectively radiate the electric RF field. Magnetic RF fields are not used. The applicators can be connected to arrays and be operated with predetermined amplitude and phase using separate transmitting channels to influence the field distribution and depth effect.

It is the underlying purpose of the present invention to provide an NMR transmitting and receiving apparatus with improved RF properties, in particular, one in which the transverse RF-B1-field can be distributed in a defined, controlled manner.

SUMMARY OF THE INVENTION

This object is achieved by an apparatus for generating and/or detecting radio frequency (RF)-B1 fields in an investigational volume of a magnetic resonance (MR) device, wherein the apparatus comprises a surface coil which has a tubular shape and is formed from a conducting strip which is capacitively closed at least two neighboring ends, wherein the ratio between the length L and the width W of the strip is $\leq 30$ and wherein the volume under investigation is disposed outside of the space surrounded by the strip, next to an outer surface of the surface coil such that the B1 field lines generated by the surface coil in the investigational volume extend substantially parallel to this outer surface.

Surface coils having this geometry are called current sheet antennas. The current sheet antennas (CSAS) are used in accordance with the invention in signal transmitting or signal detecting MRI methods. In particular, the CSAs generate transverse magnetic RF fields (B1 fields) orthogonal to the surface normal of the antenna, i.e. orthogonal to the surface normal of the outer surface of the surface coil. Another advantage is the lack of a normal component of the radio frequency electric field parallel to the surface normal of the antenna. The surfaces of the CSAs have a shielding effect with respect to the electric field. This results in high efficiency for the generation and detection of the magnetic RF field compared to conventional planar surface coils of similar size.

In the loaded (mounted) state, the inventive CSA has a high intrinsic Q, typically in a range between 100 and 200, in particular also when the CSA is used in the vicinity of media producing dielectric loss, such as human tissue. The loaded intrinsic Q is thereby similar to the unloaded intrinsic Q (intrinsic Q in vacuum). In contrast thereto, conventional volume coils only obtain loaded Q values in the range of 20–50.

The inventive CSA typically consists of a connected, approximately box-shaped or cylindrical conductor surface with at least one gap along the open direction (tube direction) of the CSA. The box shape of the CSA preferably has a side length S, a width W and a height H of S>W>H. For magnetic resonance tomography applications of a human head, dimensions of S=160 mm, W=80 mm and H=35 mm have proven to be advantageous. The gap is capacitively bridged, with a desired narrow-band resonance frequency being adjusted through selection of the capacitances. The CSA is typically excited via a coupling loop and a tuning capacitor. Other excitement with additional Balun transformations is possible. The gap can also be capacitively bridged through overlapping strip sections with an optional intermediate dielectric (not short-circuiting). The contact surface with the dielectric is preferably as large as possible in order to minimize the RF current sheet density.

In a preferred embodiment of the inventive apparatus, the tube shape of the surface coil has a rectangular cross-section such that the strip surrounds a cuboid space. Production of the rectangular cross-section having a well-defined flat abutment surface is particularly simple.

In one particularly preferred embodiment, the outer surface of the surface coil which is adjacent to the volume under investigation has recesses and/or openings thereby defining the surface current density in the surface coil. This permits, in particular, modification of the resonance frequency of the CSA and/or of the magnetic field distribution outside of the CSA.

These advantages can also be obtained in another preferred embodiment, wherein the space surrounded by the strip is at least partially filled with a dielectric. The dielectric may also be used to reinforce and mechanically stabilize the surface coil.

In an advantageous embodiment, the apparatus additionally comprises at least one planar coil, wherein the planar coil can generate an additional RF-B1 field in the volume under investigation which is orthogonal to the B1 field lines generated by the surface coil. The planar coil and the CSA surface coil are exactly geometrically decoupled from each other to permit crossed-coil operation with individual transmitting and receiving coils.

In a preferred further development of this embodiment, the apparatus comprises active decoupling units for switching the surface coil and/or the planar coil to each be temporarily resonance-free. This simplifies and improves the crossed-coil operation.

In a fundamental preferred embodiment, the inventive apparatus has several surface coils, wherein the surface coils are connected together to form a coil array. The coil array may be used to precisely influence the transverse RF-B1 magnetic field in the volume under investigation (typically in the center of the apparatus) i.e. for generating circularly polarized fields or for precise local intensity increase of the RF magnetic field. The latter can be used to improve the signal-to-noise ratio in certain partial areas of the volume under investigation. The magnetic coupling of the surface coils can be used for generating these local field increases.

In an advantageous further development of this embodiment, the individual surface coils can be fed with predetermined phases and amplitudes to facilitate precise setting and/or influence of the RF-B1 field.

In another advantageous further development, the individual surface coils can be alternatively or additionally operated with transmitting and receiving multiple contact switches and with separate transmitting and receiving units. This also facilitates precise setting and/or influence of the RF-B1 field. In particular, a 4 channel arrangement can be obtained through control of 4 transmitters, wherein the 4 array elements are fed with the same amplitude but with a phase shifted by 90°, respectively. This arrangement permits generation or detection of a circularly polarized magnetic field.

In another further alternative or additional development, the individual surface coils are decoupled from each other using passive decoupling networks. This also facilitates precise setting and/or influence of the RF-B1 field.

In an advantageous further alternative or additional development of the above-mentioned embodiment, the individual surface coils can be alternately used for transmitting and detecting to control the phases and amplitudes of fed RF signals.

One embodiment is also preferred with which the apparatus comprises at least one first surface coil and a second surface coil, wherein the resonance frequency of the second surface coil differs from the resonance frequency of the first surface coil. Double resonance experiments can be carried out with this embodiment.

In another advantageous embodiment of the inventive apparatus, the apparatus comprises two substantially identical surface coils which are disposed such that they are mutually rotated by 90°, and have a common central overlapping region, wherein the strips of the surface coils have strip sections which extend substantially parallel to the outer surfaces of the surface coils adjacent to the volume under investigation, and wherein the two surface coils are mutually integral. The capacitively bridged gaps of the two surface coils may be mounted to the respective front surfaces. Alternatively, 4 bridged gaps may also be provided outside the center of the apparatus. Feeding through two RF signals which are phase-shifted by 90° permits generation or detection of a circularly polarized RF-B1 field.

The invention also includes an apparatus for generating and/or detecting radio frequency (RF) B1 fields in an investigational volume of a magnetic resonance (MR) device, wherein the apparatus comprises a surface coil which is formed from at least two parallel, coinciding, conducting, flat strip sections which are capacitively closed at their edges, wherein the surface coil has a four-fold symmetry, the four-fold axis of symmetry extending perpendicular to the planes of the strip sections, and wherein the volume under investigation is disposed outside of the space surrounded by the strip sections and bordering an outer surface of the surface coil such that the B1 field lines generated by the surface coil in the volume under investigation extend substantially parallel to this outer surface. This apparatus is also suitable for generating circularly polarized RF-B1 fields using two RF input signals which are phase-shifted by 90°.

In an advantageous embodiment, each strip section has the shape of a Swiss Cross. This geometrical shape can be realized in a particularly simple and inexpensive fashion.

Further advantages of the invention can be extracted from the description and the drawing. The features mentioned above and below may be used in accordance with the invention either individually or collectively in arbitrary combination. The embodiments shown and described are not to be understood as exhaustive-enumeration but have exemplary character for describing the invention.

The invention is shown in the drawing and explained in more detail with reference to embodiments.

DESCRIPTION OF THE PREFERRED EMBODIMENT

Figure 1:
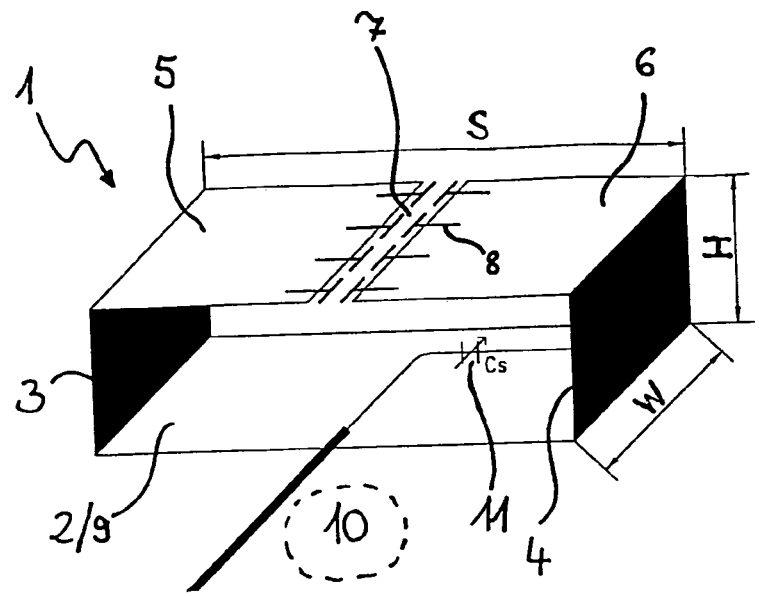
FIG. 1 shows an embodiment of an inventive apparatus with rectangular cross-section.

FIG. 1 shows a schematic perspective view of an inventive apparatus for generating- and/or detecting RF-B1 fields in an investigational volume of a nuclear magnetic resonance device.

The apparatus substantially comprises a surface coil 1 which is designed as box-shaped, connected, and metallic, conducting band. The surface coil 1 has a lower side 2, two side surfaces 3, 4 and a two-piece upper side 5, 6. The two-piece upper side 5, 6 is interrupted by a gap 7. Several capacitors 8 are mounted to the facing ends of the two-piece upper side 5, 6, to conductingly close the conducting strip for radio frequency (RF) currents. The shape of the strip is defined by the dimensions of the cuboid space surrounded by the strip. This cuboid space extends from the left-hand side to the right-hand side of S, i.e. one side length S in FIG. 1, from the top to the bottom of H, i.e. a height H in FIG. 1, and at an inclination into the plane of the drawing of W, i.e. a width W in FIG. 1. The band-like character of the surface coil 1 is guaranteed in that the width W of the surface coil 1 cannot be neglected compared to the total length L of the strip of 2*S+2*H, in particular L/W is smaller than or equal to 30. A ratio L/W of approximately 3 to 8 is particularly preferred. The cross-section of the surface coil 1, defined by a plane intersecting the plane of the drawing of FIG. 1, is rectangular.

The lower side 2 of the surface coil 1 has an outer surface 9 facing a volume under investigation 10. The outer surface 9 preferably directly abuts a body under investigation, wherein the body under investigation substantially fills the volume under investigation 10.

The surface coil 1 of the stated inventive geometry is also called a sheet coil (CSA). The shape of the surface coil may be stabilized by completely or partially filling the cuboid space surrounded by the conducting strip with a mechanically rigid dielectric.

The surface coil 1 is excited via a feed in circuit and a tuning capacitor 11. The generated magnetic field has field lines which project through the surface coil 1 from the front to the rear (or from the rear to the front, i.e. in the tubular direction), and field lines in the outer region of the surface coil 1 close to the strip, which extend anti-parallel to the field lines extending inside the coil. The field lines extend in a curved manner at the front and rear coil end. The field lines generated by the surface coil 1 in the region of the volume under investigation 10 thereby extend substantially parallel to the outer surface 9 and parallel to the side surfaces 2, 3.

In accordance with the invention, the field lines generated by the surface coil 1 in the volume under investigation 10 may be easily caused to extend orthogonally to the static $B_0$ field lines of the NMR device. This may be effected through suitable orientation of the surface coil 1. Moreover, the normal to the outer surface 9 may be oriented parallel to the static magnetic field $B_0$. The RF-B1 field generated by the surface coil 1 preferably extends parallel to the antenna plane (defined by the outer surface 9). In contrast thereto, conventional planar coils can only generate field lines perpendicular to their antenna plane.

Figure 2:
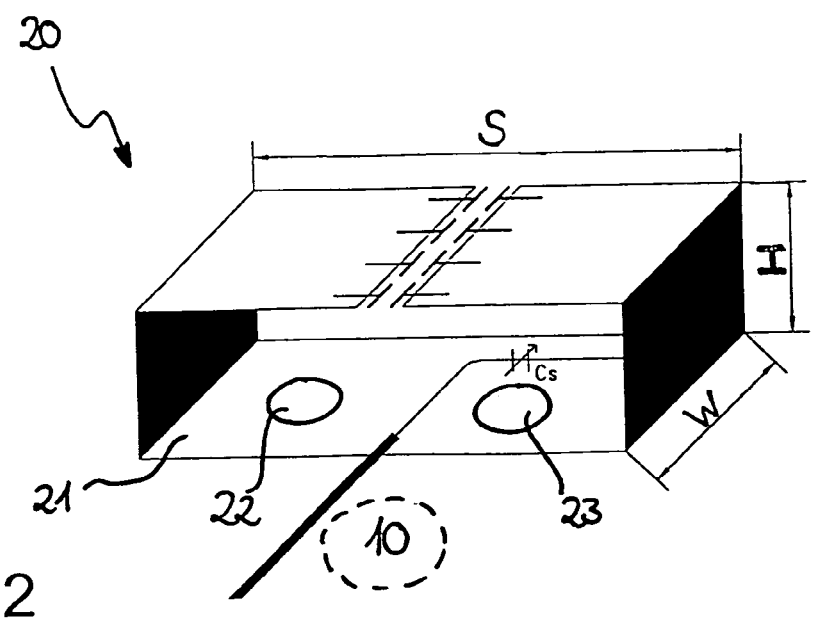
FIG. 2 shows an embodiment of an inventive apparatus with two openings on the outer side of the surface coil facing the volume under investigation.

FIG. 2 shows a modified embodiment of the surface coil of FIG. 1. A surface coil 20 has two openings 22, 23 on its lower side 21 which define the surface current density on the lower side 21 of the surface coil 20.

Figure 3:
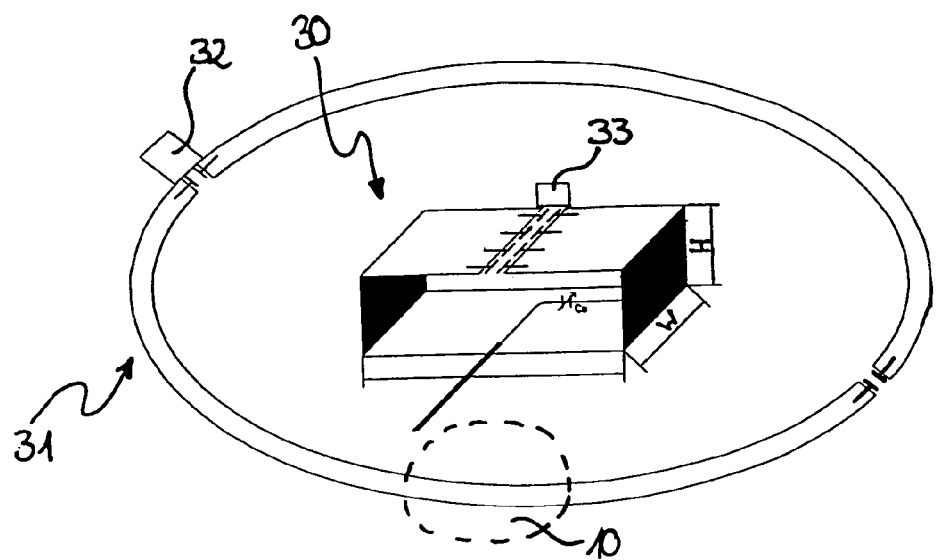
FIG. 3 shows an embodiment of an inventive apparatus with an additional planar coil.

FIG. 3 shows an embodiment of an inventive apparatus for generating and detecting RF-B1 fields. The apparatus comprises a surface coil 30 similar to FIG. 1 and also a planar coil 31. The surface coil 30 and the planar coil 31 generate mutually orthogonal B1 fields in the volume under investigation 10. The magnetic field lines of the surface coil 30 penetrate through the volume under investigation 10 from the front to the rear, while the magnetic field lines of the planar coil penetrate through the volume under investigation 10 from the top to the bottom. The antenna planes of the two coils 30, 31 are identical, thereby geometrically decoupling the two coils 30, 31.

The surface coil 30 and the planar coil 31 additionally comprise active decoupling units 32, 33 to permit use of both antennas in crossed operation as transmitting and receiving coils.

Figure 4:
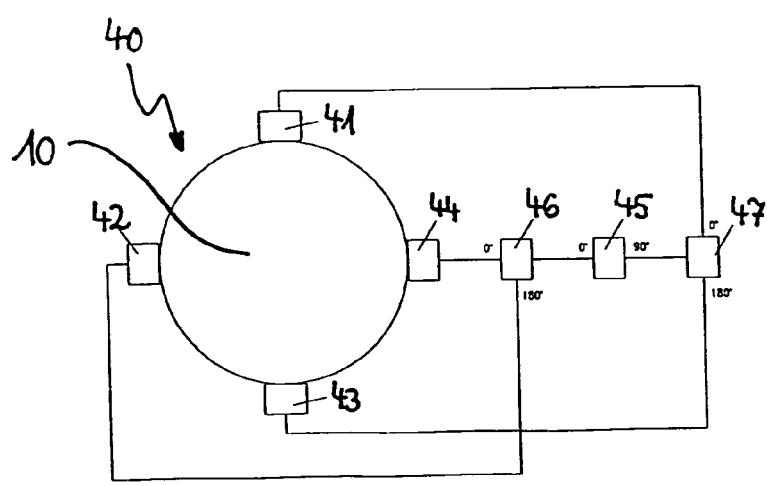
FIG. 4 shows an embodiment of an inventive apparatus comprising a 4-channel coil array with power splitters and phase shifters.

FIG. 4 shows a simple inventive 4-channel coil array 40 with four surface coils 41, 42, 43, 44 (current sheet antennas) which are uniformly arranged around a volume under investigation 10.

The geometry, amplitudes and phases of the surface coils 41–44 are selected to generate decoupling. An RF transmitting signal is fed at a power splitter/combiner 45 and is distributed to two branches having the same amplitude which are phase-shifted by 90°. These branches terminate in further power splitters/combiners 46, 47 which each generate two sub-branches having the same amplitudes and mutually phase-shifted by 180°, which are guided to the surface coils 41 to 44. All surface coils 41–44 effectively have the same signal amplitude but each has a phase shift of 90° with respect to the previous, neighboring surface coil. This permits generation or detection of a circularly polarized magnetic field. Detection is possible on an isolated port of the power splitter/combiner 45 or, with separate receivers, already at isolated ports of the power splitters/combiners 46/47.

Figure 5:
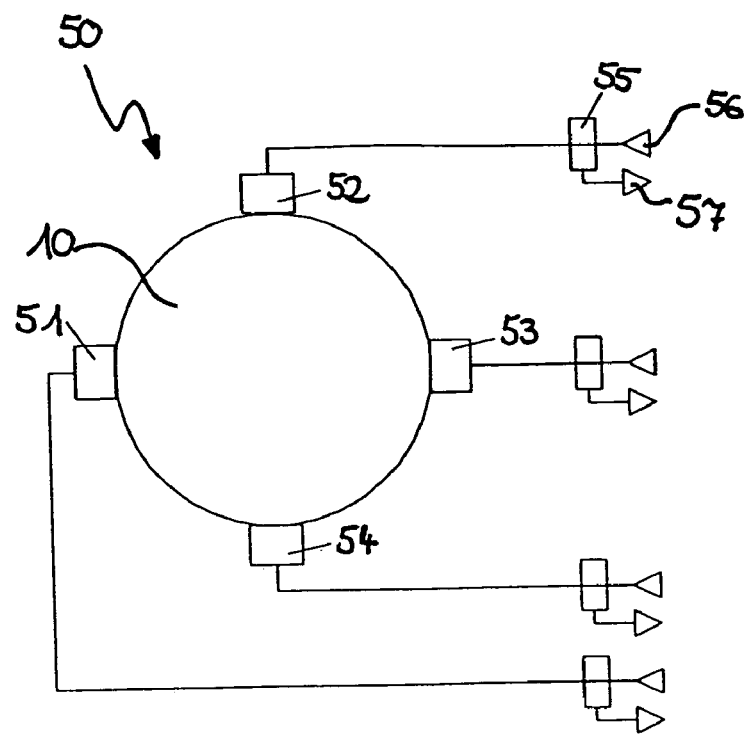
FIG. 5 shows an embodiment of an inventive apparatus comprising a 4-channel coil array with individually fed surface coils.

FIG. 5 shows another inventive 4-channel coil array 50 having four surface coils 51–54. The surface coils 51 to 54 each have separate transmitting and receiving multiple contact switch 55 with separate transmitting units 56 and receiving units 57. The surface coils 51–54 can be individually controlled with variable amplitude and phase. A circularly polarized RF-B1 field can be generated in the volume under investigation 10 through selection of a common amplitude and phase difference of 0°, 90°, 180° and 270°.

Figure 6:
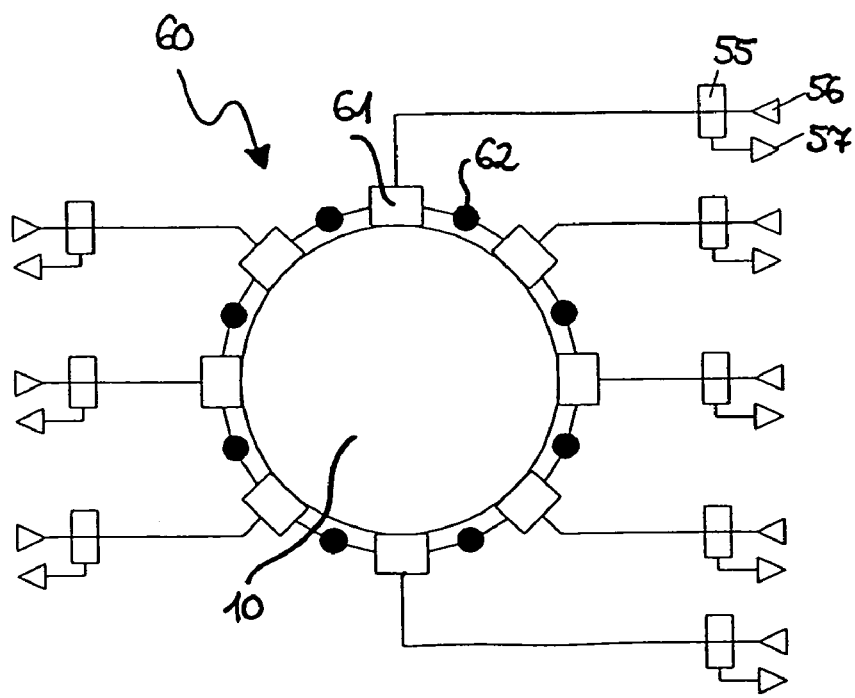
FIG. 6 shows an embodiment of an inventive apparatus comprising an 8-channel coil array with decoupling network.

FIG. 6 shows an 8-channel coil array 60 which comprises 8 surface coils 61 with separate transmitting and receiving multiple contact switches 55 and separate transmitting units 56 and receiving units 57. Passive decoupling networks 62 are also provided. The 8-channel coil array 60 may be formed from two 4-channel coil arrays in accordance with FIG. 5 which are mutually rotated by 45° and can also operate at two different frequencies.

Figure 7:
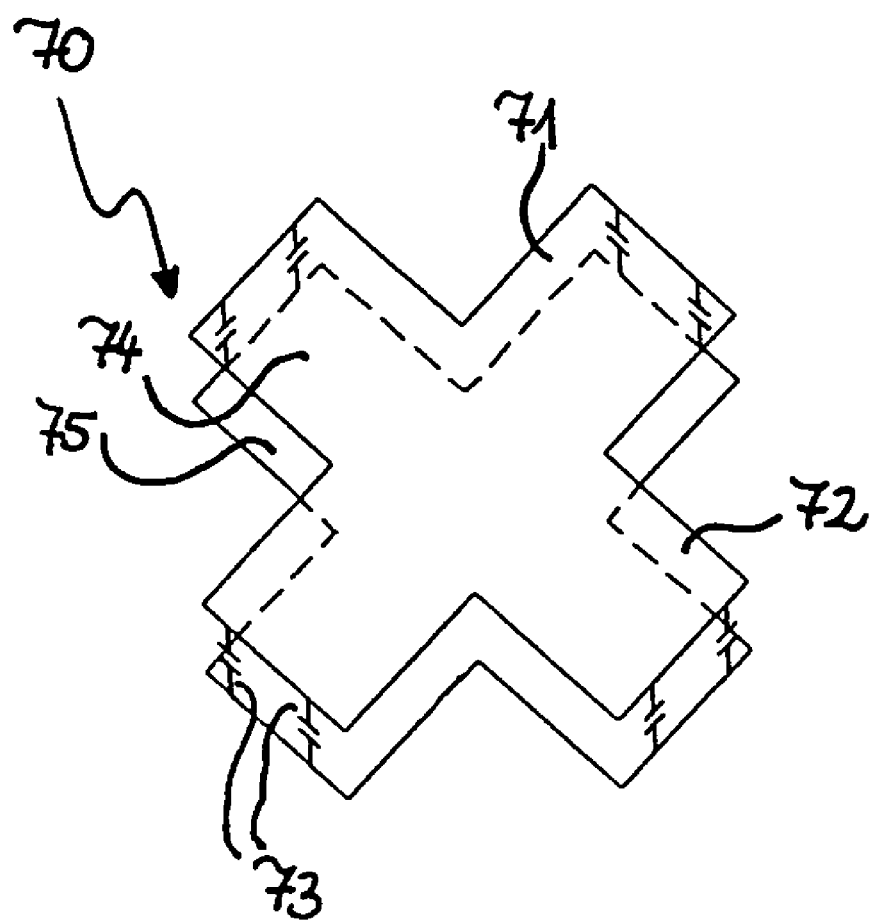
FIG. 7 shows an embodiment of an inventive apparatus with two surface coils which are rotated by 90° and are formed in one piece.

FIG. 7 shows an inventive combination 70 of two identical CSA antennas for generating a circularly polarized RF field. The two CSA antennas have bands 71, 72 which are mutually rotated by 90°, wherein the side surfaces of the bands 71, 72 are designed as gaps which are bridged with capacitors 73. The two bands 71, 72 are integral. The combination 70 comprises substantially two parallel strip sections 74, 75 each having the shape of a cross with equal arms at right angles (=Swiss Cross), in the present case each surface having a square arm, wherein one of these strip sections 74, 75 defines an outer surface of the combination 70 which is adjacent to a volume under investigation.

We claim:

1. An apparatus for generating and/or detecting radio frequency (RF)-B1 fields in an investigational volume of a magnetic resonance device, the apparatus comprising:
   a surface coil formed from a conducting strip, said conducting strip having a first end and a second end bordering said first end, said strips having a length L and a width W, with L/W≦30, said coil defining an inner space, said coil having an outer surface for positioning adjacent to said investigational volume; and
   means for capacitively coupling said first end to said second end, wherein B1 field lines generated by said surface coil in the investigational volume extend substantially parallel to said outer surface said surface coil structured and dimensioned for generating said B1 field lines suitable for magnetic resonance in an investigational volume external to said inner space of said coil.

2. The apparatus of claim 1, wherein said surface coil has a rectangular cross-section and said inner space is cuboid.

3. The apparatus of claim 1, wherein said outer surface of said surface coil, which borders the investigation of volume has recesses and/or openings.

4. The apparatus of claim 1, further comprising a dielectric, said dielectric at least partially filling said inner space.

5. The apparatus of claim 1, further comprising at least one planar coil, said planar coil generating an additional field in the investigational volume which is orthogonal to B1 field lines generated by said surface coil.

6. The apparatus of claim 5, further comprising active decoupling units for switching said surface coil and/or said planar coil to be temporarily free of resonance.

7. The apparatus of claim 1, further comprising at least one additional surface coil, wherein said surface coil and said at least one additional surface coil are connected into a coil array.

8. The apparatus of claim 7, wherein each of said surface coil and said additional coil can be driven with predetermined phases and amplitudes.

9. The apparatus of claim 7, further comprising multiple contact switches with separate transmitting and receiving units, wherein each surface coil and additional surface coil has an individual multiple contact switch and transmitting and receiving unit.

10. The apparatus of claim 7, further comprising passive networks for decoupling said surface coil and said at least one additional surface coil.

11. The apparatus of claim 7, further comprising means communicating with said surface coil and with said at least one additional coil for alternately transmitting and receiving to control phases and amplitudes of fed RF signals.

12. The apparatus of claim 1, further comprising an additional surface coil having a resonance frequency which differs from a resonance frequency of said surface coil.

13. The apparatus of claim 1, further comprising an additional surface coil which is substantially identical to said surface coil, said additional surface coil and said surface coil being rotated relative to each other by 90° and having a common central overlapping region, wherein said conducting strip of said surface coil and a conducting strip of said additional surface coil each comprise strip sections which extend substantially parallel to surface coil outer surfaces adjacent to the investigational volume, wherein said additional surface coil and said surface coil are mutually integral.

14. The apparatus of claim 1, wherein said surface coil comprises at least two parallel, equally shaped, conducting, flat band sections which are capacitively connected at their edges, wherein said surface coil has a four-fold symmetry, a four-fold axis of symmetry thereof extending perpendicular to planes of said band sections, and wherein the investigational volume is disposed outside of said inner space surrounded by said band sections, bordering said outer surface of said surface coil.

15. The apparatus of claim 14, wherein said band sections are each shaped like a Swiss Cross.

* * * * *